(12) United States Patent
Li

(10) Patent No.: US 11,917,854 B2
(45) Date of Patent: Feb. 27, 2024

(54) DISPLAY PANEL, DISPLAY DEVICE, AND DRIVING METHOD THEREOF

(71) Applicant: Wuhan China Star Optoelectronics Semiconductor Display Technology Co., Ltd., Wuhan (CN)

(72) Inventor: Xian Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 919 days.

(21) Appl. No.: 16/957,115

(22) PCT Filed: Apr. 7, 2020

(86) PCT No.: PCT/CN2020/083462
§ 371 (c)(1),
(2) Date: Jun. 23, 2020

(87) PCT Pub. No.: WO2021/164111
PCT Pub. Date: Aug. 26, 2021

(65) Prior Publication Data
US 2023/0086260 A1    Mar. 23, 2023

(30) Foreign Application Priority Data
Feb. 19, 2020    (CN) .......................... 202010102606.1

(51) Int. Cl.
*H10K 50/856* (2023.01)
*H10K 50/125* (2023.01)
(Continued)

(52) U.S. Cl.
CPC ......... *H10K 50/856* (2023.02); *G09G 3/3225* (2013.01); *H10K 50/125* (2023.02); *H10K 59/12* (2023.02); *G09G 2330/021* (2013.01)

(58) Field of Classification Search
CPC .... H10K 50/856; H10K 50/125; H10K 59/12; G09G 3/3225; G09G 2330/021
(Continued)

(56) References Cited

U.S. PATENT DOCUMENTS

2012/0224113 A1* 9/2012 Oh ..................... G02F 1/134363
445/24
2012/0243219 A1* 9/2012 Ohsawa ............... H10K 50/852
362/230
(Continued)

FOREIGN PATENT DOCUMENTS

| CN | 101763800 | 6/2010 |
|---|---|---|
| CN | 102541338 | 7/2012 |

(Continued)

*Primary Examiner* — Igwe U Anya
(74) *Attorney, Agent, or Firm* — PV IP PC; Wei Te Chung; Zhigang Ma

(57) ABSTRACT

A display panel, a display device, and a driving method thereof are provided. A light-reflecting layer is disposed under a light-emitting layer of the display panel. When the display panel is under strong light, the light-emitting layer does not work, and the light-reflecting layer reflects natural light to achieve a full-color display. When the display panel is in low light or darkness, the light-emitting layer works, and the light-reflecting layer reflects the light emitted by the light-emitting layer to reduce a working intensity of the light-emitting layer and achieves the full-color display, thereby improving service life and visual effect of organic light emitting diodes (OLEDs).

10 Claims, 4 Drawing Sheets

(51) Int. Cl.
*H10K 59/12* (2023.01)
*G09G 3/3225* (2016.01)
(58) Field of Classification Search
USPC .......................................................... 257/40
See application file for complete search history.

(56) References Cited

U.S. PATENT DOCUMENTS

| 2014/0293578 | A1 | 10/2014 | Gibson |
| 2017/0103728 | A1 | 4/2017 | Chen et al. |
| 2017/0124984 | A1* | 5/2017 | Wang .................... H10K 59/35 |

FOREIGN PATENT DOCUMENTS

| CN | 103187020 | 7/2013 |
| CN | 103198786 | 7/2013 |
| CN | 103715369 | 4/2014 |
| CN | 103903570 | 7/2014 |
| CN | 206179867 | 5/2017 |

\* cited by examiner

DISPLAY PANEL, DISPLAY DEVICE, AND DRIVING METHOD THEREOF

RELATED APPLICATIONS

This application is a National Phase of PCT Patent Application No. PCT/CN2020/083462 having International filing date of Apr. 7, 2020, which claims the benefit of priority of Chinese Patent Application No. 202010102606.1 filed on Feb. 19, 2020. The contents of the above applications are all incorporated by reference as if fully set forth herein in their entirety.

FIELD AND BACKGROUND OF THE INVENTION

The present invention relates to the field of display technologies, and in particular, to a display panel, a display device, and a driving method thereof.

In recent years, organic light emitting diode (OLED) screens have excellent characteristics, such as self-illumination which negates a need for a backlight, high contrast, thin thickness, fast response times, wide viewing angles, light weight and foldability, wide temperature ranges, and simple structures and manufacturing processes. As a result, they are developing rapidly, and their market share is expanding. They are considered to be the next generation of flat panel display emerging application technologies.

OLEDs have unique advantages in performance, and they can provide a more perfect visual experience when used on display screens. However, as self-luminous screens, the screens are composed of countless red, green, and blue sub-pixel points. In environments with outdoor strong light, in order to improve contrast, the screens need to increase brightness. When the screens are used in such high-brightness situations for a long time, performance of the sub-pixels will be reduced in varying degrees, thereby causing uneven display and affecting service life of the display screens, thus limiting popularity of the OLEDs.

Therefore, how to further reduce power consumption of the OLED screens while improving service life and visual effects of the OLEDs have become focuses of research.

SUMMARY OF THE INVENTION

The present invention provides a display panel, a display device, and a driving method thereof, which can solve problems in the prior art.

According to a first aspect of the present invention, the present invention provides a display panel comprising an array unit comprising a detection module for detecting an intensity of external natural light; and a light-emitting unit arranged on the array unit, wherein the light-emitting unit comprises a light-emitting layer and a light-reflecting layer, and the light-reflecting layer is disposed under the light-emitting layer, wherein the light-emitting layer is in a closed state when the intensity of the external natural light is greater than a first threshold, and the light-emitting layer is in an opened state when the intensity of the external natural light is less than a second threshold.

Further, the display panel further comprises a packaging unit disposed on the light-emitting unit.

Further, the array unit further comprises a thin film transistor driving module, the thin film transistor driving module is used to control the light-emitting layer to emit a self-luminous light and to control an amount of the self-luminous light emitted, and simultaneously to control the light-reflecting layer to reflect light and to control an amount of the light reflected.

Further, a material of the light-emitting layer comprises at least one of fluorene, carbazole, or thiophene.

Further, a material of the light-reflecting layer comprises at least one of a metal film, a metal-coated polyester film, or a reflective polymer.

Further, a reflectivity of the light-reflecting layer is greater than 80%.

Further, the light-emitting layer comprises a red light-emitting layer, a green light-emitting layer, and a blue light-emitting layer.

Further, the light-reflecting layer comprises a red light-reflecting layer, a green light-reflecting layer, and a blue light-reflecting layer.

According to a second aspect of the present invention, the present invention provides a display device comprises any display panel as described above.

According to a third aspect of the present invention, the present invention provides a driving method of the display device, which comprises following steps: controlling the light-reflecting layer via a thin film transistor driving module to reflect the external natural light when detecting that the intensity of the external natural light is greater than the first threshold and the light-emitting layer is in the closed state; and controlling the light-emitting layer to emit self-luminous light while controlling the light-reflecting layer to reflect the self-luminous light via the thin film transistor driving module when detecting that the intensity of the external natural light is less than the second threshold and the light-emitting layer is in the open state.

Compared with the prior art, embodiments of the present invention provide a light-reflecting layer under a light-emitting layer of a display panel. When the display panel is under strong light, the light-emitting layer does not work, and the light-reflecting layer reflects natural light to achieve a full-color display. When the display panel is in low light or darkness, the light-emitting layer works, and the light-reflecting layer reflects the light emitted by the light-emitting layer to reduce a working intensity of the light-emitting layer and achieve the full-color display, thereby improving service life and visual effect of organic light emitting diodes (OLEDs).

DESCRIPTION OF SPECIFIC EMBODIMENTS OF THE INVENTION

Figure 1:
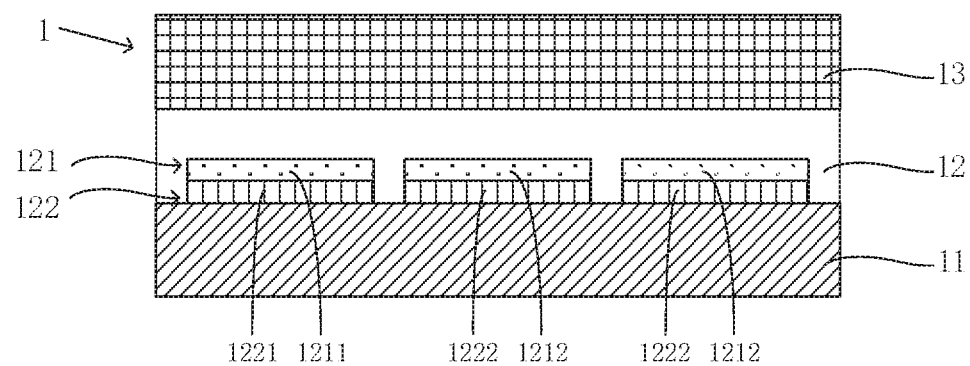
FIG. 1 is a schematic structural view of a display panel provided by an embodiment of the present invention.

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

The terms "first," "second," "third," etc. (if any) in the description and claims of the present invention and the above drawings are used to distinguish similar objects, not necessarily to describe a specific order or sequence. It should be understood that the objects so described are interchangeable under appropriate circumstances. In addition, the terms "including" and "having" and any variations thereof are intended to cover non-exclusive inclusions.

In specific embodiments, the drawings discussed below and the embodiments used to describe the principles disclosed in the present invention are for illustration only and should not be construed as limiting scopes of disclosure. Those skilled in the art will understand that the principles of the present invention can be implemented in any suitably arranged system. Exemplary embodiments will be explained in detail, and examples of these embodiments are shown in the drawings. In addition, a terminal according to an exemplary embodiment will be described in detail with reference to the drawings. The same reference numbers in the drawings refer to the same elements.

The terminology used in the description of the invention is for the purpose of description. Expressions used in the singular encompasses the plural forms of expression unless the context clearly dictates otherwise. In the description of the present invention, it is to be understood that the terms such as "comprises," "comprising," and "having" are intended to indicate the presence of the features, numbers, steps, acts, or combinations thereof disclosed in the specification. It is not intended to exclude the possibility that one or more other features, numbers, steps, acts or combinations may be added. The same reference numerals in the drawings denote the same parts.

Referring to FIG. 1, an embodiment of the present invention provides a display panel 1 comprising an array unit 11, a light-emitting unit 12, a light-emitting layer 121, a red light-emitting layer 1211, a green light-emitting layer 1212, a blue light-emitting layer 1213, a light-reflecting layer 122, a red light-reflecting layer 1221, a green light-reflecting layer 1222, a blue light-reflecting layer 1223, and a packaging unit 13.

Figure 2:
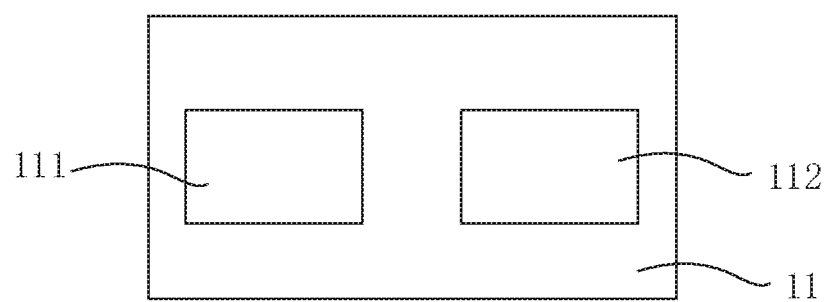
FIG. 2 is a schematic structural view of a light-emitting unit provided by the embodiment of the present invention.

Combined with FIG. 2, the array unit 11 comprises a detection module 111 and a thin film transistor driving module 112. The detection module 111 is used to detect an intensity of external natural light. The thin film transistor driving module 112 is used to control the light-emitting layer 121 to emit a self-luminous light and to control an amount of the self-luminous light emitted, and simultaneously to control the light-reflecting layer 122 to reflect light and to control an amount of the light reflected.

The light-emitting unit 12 is disposed on the array unit 11. The light-emitting unit 12 comprises the light-emitting layer 121 and the light-reflecting layer 122, and the light reflecting layer 122 is disposed under the light-emitting layer 121. The light-emitting layer 121 is in a closed state when the intensity of the external natural light is greater than a first threshold and is in an opened state when the intensity of the external natural light is less than a second threshold. Such a design, by reducing working time of the light-emitting layer 121, can delay its performance degradation, thereby prolonging the service life of the display panel.

The light-emitting layer 121 comprises the red light-emitting layer 1211, the green light-emitting layer 1212, and the blue light-emitting layer 1213. A material of the light-emitting layer 121 comprises but is not limited to fluorenes, carbazoles, and thiophenes.

The light-reflecting layer 122 comprises the red light-reflecting layer 1221, the green light-reflecting layer 1222, and the blue light-reflecting 1223. A material of the light-reflecting layer 122 comprises but is not limited to a metal film, a metal-coated polyester film, and a reflective polymer, and a reflectivity of the light-emitting layer is greater than 80%, and may even be as high as 90%.

Figure 3:
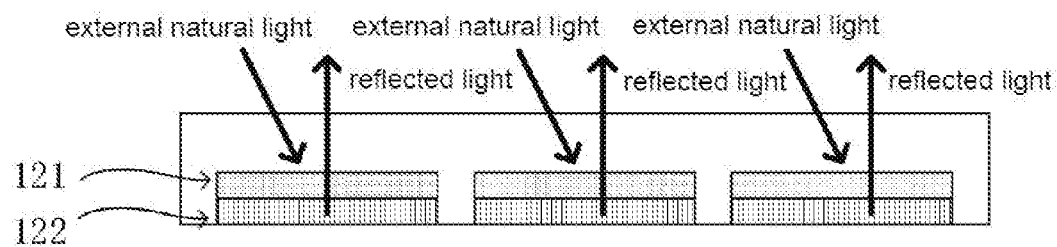
FIG. 3 is a schematic view of light-emitting of the light emitting unit under strong light provided by the embodiment of the present invention.

With reference to FIG. 3, when the light of the external natural light is greater than the first threshold, the light-reflecting layer 122 reflects the external natural light to achieve a full-color display, which solves problems of low brightness and poor contrast of the display panel, thereby improving a visual effect of the display panel under strong light.

Figure 4:
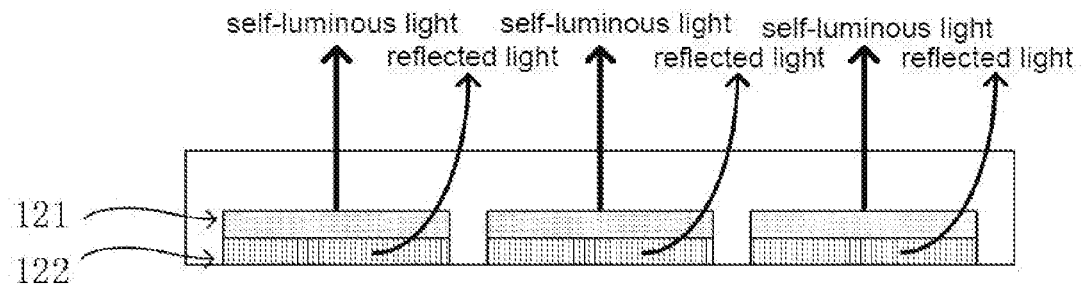
FIG. 4 is a schematic view of light-emitting of the light emitting unit under low light or darkness provided by the embodiment of the present invention.

With reference to FIG. 4, when the light intensity of the external natural light is less than the second threshold, the self-luminescence emitted by the light-emitting layer 121 is reflected to reduce working intensity of the light-emitting layer 121, which can achieve low power consumption and achieve the full-color display.

Figure 5:
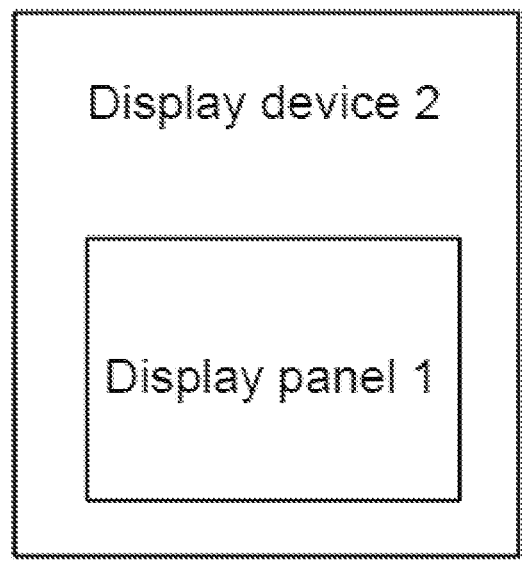
FIG. 5 is a schematic structural view of a display device provided by the embodiment of the present invention.

Referring to FIG. 5, an embodiment of the present invention provides a display device 2 comprising the display panel 1 described above. The display device 2 may be any product or component with a display function such as a mobile phone, a tablet computer, a TV, a display, a notebook computer, a digital photo frame, a navigator, etc.

Figure 6:
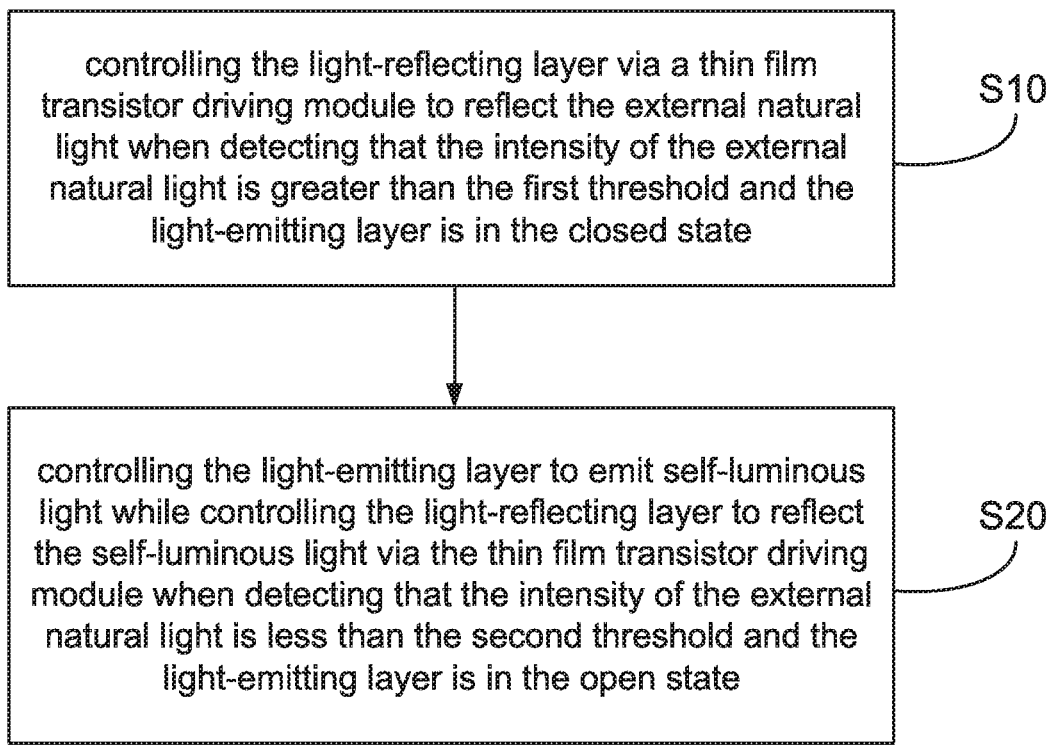
FIG. 6 is a flowchart of steps in a driving method of the display device provided by the embodiment of the present invention.

Referring to FIG. 6, an embodiment of the present invention provides a driving method of the display device, comprising following steps.

S10, controlling the light-reflecting layer via a thin film transistor driving module to reflect the external natural light when detecting that the intensity of the external natural light is greater than the first threshold and the light-emitting layer is in the closed state.

In the embodiment, in the case of strong light, the light-emitting layer is not working, reducing its use time to prolong the service life of the display panel, while using the light-reflecting layer to emit the external natural light to achieve the full-color display, to solve the problem of low brightness and poor contrast, and to improve the visual effect of the panel under the strong light.

S20, controlling the light-emitting layer to emit self-luminous light while controlling the light-reflecting layer to reflect the self-luminous light via the thin film transistor driving module when detecting that the intensity of the external natural light is less than the second threshold and the light-emitting layer is in the open state.

In the embodiment, under low light or dark conditions, the light-emitting layer works, and at the same time, the light-reflecting layer reflects the light emitted by the light-emitting layer to reduce the working intensity of the light-emitting layer, thereby achieving the low power consumption and realizing the full-color display.

In the present invention, the light-reflecting layer is disposed under the light-emitting layer of the display panel. When the display panel is under the strong light, the light-emitting layer does not work, and the light-reflecting layer reflects natural light to achieve the full-color display. When the display panel is in low light or darkness, the light-emitting layer works, and the light-reflecting layer reflects the light emitted by the light-emitting layer to reduce the working intensity of the light-emitting layer and achieves the full-color display, thereby improving the service life and the visual effect of organic light emitting diodes (OLEDs).

The display panel, the display device and the driving method thereof provided by the embodiments of the present invention have been described in detail above. In the above, various other corresponding changes and modifications can be made according to the technical solutions and technical ideas of the present invention to those skilled in the art, and all such changes and modifications are within the scope of the claims of the present invention.

What is claimed is:

1. A display panel, comprising:
   an array unit comps sing a detection module for detecting an intensity of external natural light; and
   a light-emitting unit arranged on the array unit, wherein the light-emitting unit comprises light-emitting layer and a light-reflecting layer, and the light-reflecting layer is disposed under the light-emitting layer, wherein the light-emitting layer is in a closed state when the intensity of the external natural light is greater than a first threshold, and the light-emitting layer is in an open state when the intensity of the external natural light is less than a second threshold,
   wherein the array unit further comprises a thin film transistor driving module, the thin film transistor driving module is used to control the light-emitting layer to emit a self-luminous light and to control an amount of the self-luminous light emitted, and simultaneously control the light-reflecting layer to reflect light and to control an amount of light reflected.

2. The display panel as claimed in claim 1, further comprising a packaging unit disposed on the light-emitting unit.

3. The display panel as claimed in claim 1, wherein a material of the light-emitting layer comprises at least one of fluorene, carbazole, or thiophene.

4. The display panel as claimed in claim 1, wherein a material of the light-reflecting layer comprises at least one of a metal film, a metal-coated polyester film, or a reflective whinier.

5. The display panel as claimed in claim 1, wherein a reflectivity of the light-reflecting layer is greater than 80%.

6. The display panel as claimed in claim 1, wherein the light-emitting layer comprises a red light-emitting layer, a green light-emitting layer, and a blue light-emitting layer.

7. The display panel as claimed in claim 1, wherein the light-reflecting layer comprises a red light-reflecting layer, a green light-reflecting layer, and a blue light-reflecting layer.

8. A display device, comprising the display panel as claimed in claim 1.

9. A driving method of the display device as claimed in claim 8, comprising following steps:
   controlling the light-reflecting layer via the thin film transistor driving module to reflect the external natural light when detecting that the intensity of the external natural light is greater than the first threshold and the light-emitting layer is in the closed state; and
   controlling the light-emitting layer to emit self-luminous light while controlling the light-reflecting layer to reflect the self-luminous light via the thin film transistor driving module when detecting that the intensity of the external natural light is less than the second threshold and the light-emitting layer is in the open state.

10. The driving method of claim 9, further comprising:
    controlling an amount of light reflected by the light-reflecting layer via the thin film transistor driving module, in a case that the light-emitting layer is in the closed state; and
    controlling an amount of the self-luminous light emitted by the light-emitting layer and the amount of the light reflected by the light-reflecting layer via the thin film transistor driving module, in a case that the light-emitting layer is in the open state.

* * * * *